(12) United States Patent
Schwarz et al.

(10) Patent No.: US 7,129,178 B1
(45) Date of Patent: Oct. 31, 2006

(54) REDUCING DEFECT FORMATION WITHIN AN ETCHED SEMICONDUCTOR TOPOGRAPHY

(75) Inventors: Benjamin C. E. Schwarz, Sunnyvale, CA (US); Chan Lon Yan, Los Gatos, CA (US); Hanna Bamnolker, Cupertino, CA (US); Daniel J. Arnzen, Eden Prairie, MN (US)

(73) Assignee: Cypress Semiconductor Corp., San Jose, CA (US)

( * ) Notice: Subject to any disclaimer, the term of this patent is extended or adjusted under 35 U.S.C. 154(b) by 146 days.

(21) Appl. No.: 10/074,888

(22) Filed: Feb. 13, 2002

(51) Int. Cl.
*H01L 21/302* (2006.01)
*H01L 21/461* (2006.01)

(52) U.S. Cl. .................... 438/706; 438/707; 438/710; 438/714

(58) Field of Classification Search ........ 438/706–710, 438/714, 718, 719, 720, 724, 725, 690–693
See application file for complete search history.

(56) References Cited

U.S. PATENT DOCUMENTS

| | | | |
|---|---|---|---|
| 5,626,775 A * | 5/1997 | Roberts et al. ............... 216/67 |
| 5,962,195 A * | 10/1999 | Yen et al. .................. 430/316 |
| 6,024,887 A | 2/2000 | Kuo et al. |
| 6,063,709 A | 5/2000 | Kuo et al. |
| 6,105,588 A | 8/2000 | Li et al. |
| 6,117,786 A * | 9/2000 | Khajehnouri et al. ....... 438/700 |
| 6,194,284 B1 | 2/2001 | Chen |
| 6,211,035 B1 | 4/2001 | Moise et al. |
| 6,230,719 B1 | 5/2001 | Wensel |
| 6,232,209 B1 * | 5/2001 | Fujiwara et al. ............ 438/585 |
| 6,242,356 B1 | 6/2001 | Jang et al. |
| 6,274,500 B1 | 8/2001 | Xuechun et al. |
| 6,387,287 B1 * | 5/2002 | Hung et al. .................. 216/67 |
| 6,403,484 B1 * | 6/2002 | Lim et al. .................... 438/692 |
| 6,420,095 B1 * | 7/2002 | Kawamura et al. ......... 430/313 |
| 6,444,584 B1 * | 9/2002 | Hsiao ........................ 438/706 |
| 6,630,407 B1 * | 10/2003 | Keil et al. .................. 438/717 |

* cited by examiner

*Primary Examiner*—Duy-Vu N Deo
(74) *Attorney, Agent, or Firm*—Mollie E. Lettang; Kevin L. Daffer; Daffer McDaniel, LLP

(57) ABSTRACT

A method is provided which includes etching one or more layers in an etch chamber while introducing a noble gas heavier than helium into the etch chamber. In a preferred embodiment, the introduction of such a noble gas may reduce the formation of defects within an etched portion of the semiconductor topography. Such defects may include bilayer mounds of nitride and a material comprising silicon, for example. In some embodiments, the method may include etching a stack of layers within a single etch chamber. The stack of layers may include, for example, a nitride layer interposed between an anti-reflective layer and an underlying layer. In addition, the single etch chamber may be a plasma etch chamber designed to etch materials comprising silicon. As such, the method may include etching an anti-reflective layer in a plasma etch chamber designed to etch materials comprising silicon.

11 Claims, 4 Drawing Sheets

REDUCING DEFECT FORMATION WITHIN AN ETCHED SEMICONDUCTOR TOPOGRAPHY

BACKGROUND OF THE INVENTION

1. Field of the Invention

This invention relates to semiconductor device manufacturing, and more particularly, to an improved method for processing a semiconductor topography.

2. Description of the Related Art

The following descriptions and examples are not admitted to be prior art by virtue of their inclusion within this section.

In general, it is desirable to have an integrated circuit fabrication process produce a semiconductor device with structures and spaces within certain dimension specifications. In some cases, the dimensions of structures and spaces within a device may be referred to as critical dimensions. "Critical dimension" (CD), as used in this application, may generally refer to the dimensional design value of a feature. Critical dimensions are of interest since they may represent the smallest dimension that may be formed on a semiconductor topography using various techniques such as photolithography and etch processes. In addition, it is desirable to have each processing step of a semiconductor fabrication process, including the photolithography and etch processes, produce a minimal amount of defects. Depending on a defect's size, location, and composition, a defect within a device may cause a failure within a subsequently formed integrated circuit. For example, a defect in a contact may increase resistance of the contact or may even prevent sufficient contact to the underlying structure. In other cases, defects may cause elevational disparities within a semiconductor topography, thereby making further deposition of layers and fabrication of structures difficult. Failures within integrated circuits can cause an increase in the overall manufacturing costs associated with integrated circuit fabrication.

As such, it is desirable for integrated circuit fabrication processes to be optimized such that the formation of defects is minimized and critical dimensions are well controlled. In order to reduce the amount of defects within an etch process, for example, and control the critical dimensions of a device component, different etch tools are typically used to etch different layers of a device structure. For example, oxide etch tools are generally used to etch dielectric materials and require high, energetic uniform ion bombardment such that defects may be minimized. In particular, oxide etch tools may produce a plasma density between approximately $2.0 \times 10^{14}$ molecules/cm$^3$ and approximately $2.0 \times 10^{17}$ molecules/cm$^3$ and may be referred to as "high-density" etch tools. In addition, oxide etch tools are typically run at a pressure between approximately 7.5 mTorr and 5.6 Torr. Generally, anti-reflective layers may be etched in an oxide etch tool since anti-reflective materials have similar properties of dielectric layers. Etching materials comprising silicon, however, typically requires higher CD control and thus requires low ion energies with precise wafer temperature control. As such, in an embodiment in which a topography including a dielectric and a material comprising silicon is etched, for example, the etch process may include using at least two different etch tools. In addition, the formation of defects within "silicon" etch tools, however, may be higher than in oxide etch tools. Consequently, an undesirable amount of defects may exist within a structure formed within a silicon etch tool.

It would, therefore, be desirable to develop an etch process that creates fewer defects during the fabrication of an integrated circuit. In particular, such an etch process preferably fabricates device components of the integrated circuit within critical dimension specifications.

SUMMARY OF THE INVENTION

The problems outlined above may be in large part addressed by a method for processing a semiconductor topography. In particular, a method is provided which includes etching one or more layers in an etch chamber while introducing a noble gas heavier than helium into the etch chamber. In a preferred embodiment, the introduction of such a noble gas may reduce the formation of or remove defects within an etched portion of the semiconductor topography. Such defects may include, for example, bilayer mounds comprising nitride and a material comprising silicon. In some cases, the defects may include nitride and polysilicon bilayer mounds. In some embodiments, the method may include etching a stack of layers within a single etch chamber. The stack of layers may include, for example, a cap layer interposed between an anti-reflective layer and an underlying layer. In addition, the single etch chamber may be a plasma etch chamber designed to etch materials comprising silicon, such as monocrystalline silicon, silicon-germanium, or polysilicon. As such, the method may include etching an anti-reflective layer in a plasma etch chamber designed to etch materials comprising silicon.

As stated above, the method may include etching a stack of layers within a single etch chamber. In some embodiments, the stack of layers may include a cap layer interposed between an anti-reflective layer and an underlying layer. In some embodiments, the cap layer may include nitride. For example, in some cases, the cap layer may include silicon nitride. In addition, the underlying layer may include a material comprising silicon, such as monocrystalline silicon, silicon-germanium, or polysilicon, for example. In some embodiments, the method may include patterning a photoresist layer arranged over the anti-reflective layer prior to etching the anti-reflective layer. In such an embodiment, the method may further include removing remaining portions of the photoresist layer and anti-reflective layer subsequent to etching the cap layer.

The method may further include introducing a noble gas heavier than helium, such as argon, xenon, neon, krypton, or radon, for example, into an etch chamber comprising the etching process. Such an introduction of gas may be during etching of the anti-reflective layer and/or of the cap layer, for example. In some embodiments, the method may include introducing a first noble gas heavier than helium into an etch chamber during etching of the anti-reflective layer and introducing a second noble gas heavier than helium into the etch chamber during etching of the cap layer. In a preferred embodiment, the first and second noble gases may be the same. Alternatively, the first and second noble gases may be different. In some cases, the introduction of the noble gas may be during etching of a layer underlying the cap layer and/or the anti-reflective layer. In such an embodiment, the method may include introducing a third noble gas heavier than helium into the etch chamber during etching of the lower layer. As stated above, the introduction of a noble gas heavier than helium into an etch chamber during etching of a semiconductor topography preferably reduces the formation of defects within an etched portion of the semiconductor topography. In some embodiments, the defects may include bilayer mounds comprising nitride and a material comprising silicon. For example, the defects may include nitride and polysilicon bilayer mounds in some cases.

In some cases, the single etch chamber used for the etching process may be a plasma etch chamber designed to etch materials comprising silicon. As such, the method described herein may include etching an anti-reflective layer in a plasma etch chamber designed to etch materials comprising silicon. In addition, the method may include introducing a noble gas heavier than helium into a plasma etch chamber designed to etch materials comprising silicon during an etching process of an anti-reflective layer. Moreover, the method may include etching a cap layer, such as silicon nitride, arranged beneath the anti-reflective layer in the same silicon plasma etch chamber.

In a preferred embodiment, the etching process may include forming a semiconductor structure within a semiconductor topography. The semiconductor structure may include, for example, a gate structure or an interconnect line. In another embodiment, the etching process may include forming a trench for the subsequent formation of a semiconductor structure, such as a shallow trench isolation region, contact, or via, for example. In a preferred embodiment, the semiconductor structure and/or the trench may include a dimension within a critical dimension specification of the device. In some cases, the etch chamber used for the etching process may be adapted to form the dimension of the semiconductor structure within such a critical dimension specification.

There may be several advantages to processing a semiconductor topography according to the method described herein. For example, a topography etched by such a method may include fewer defects. In particular, such a method may prevent, reduce, and/or eliminate the number of defects within an etched portion of a semiconductor topography. Such a reduction and/or elimination of defects may advantageously produce a greater number of functional devices within a given lot of wafers. Furthermore, the method may fabricate semiconductor structures within a critical dimension specification. Consequently, a semiconductor device may be fabricated within the design specification of the device. In addition, such a method may simplify the fabrication process by enabling the etching process of a stack of layers to be conducted within a single etch chamber. Such a simplification may advantageously reduce manufacturing costs and increase production throughput.

BRIEF DESCRIPTION OF THE DRAWINGS

Other objects and advantages of the invention will become apparent upon reading the following detailed description and upon reference to the accompanying drawings in which.

Figure 1:
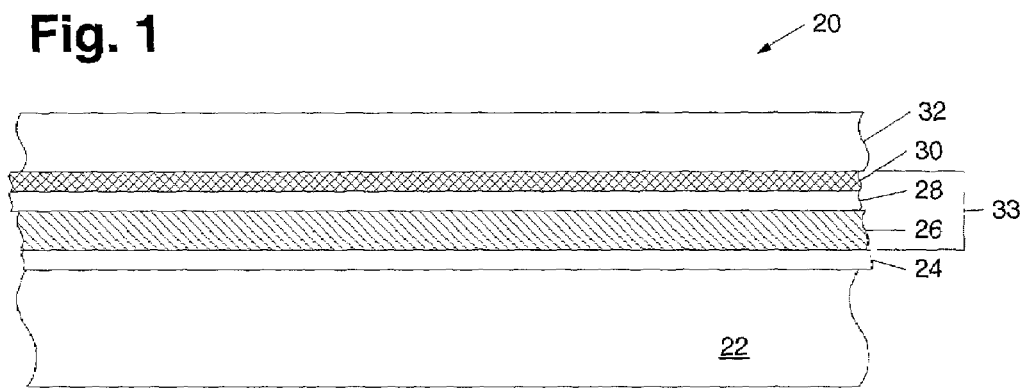
FIG. 1 depicts a partial cross-sectional view of a semiconductor topography in which a stack of layers are interposed between a resist layer and a semiconductor layer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary embodiments of a method for processing a semiconductor topography are shown in FIGS. 1–12. In particular, a method is provided which includes etching one or more layers in an etch chamber while introducing a noble gas heavier than helium into the etch chamber. In a preferred embodiment, the introduction of such a noble gas may reduce the formation of or remove defects within an etched portion of the semiconductor topography. FIG. 1 depicts a partial cross-sectional view of semiconductor topography 20 in which a plurality of layers is formed upon and in contact with each other. In particular, semiconductor topography 20 may include dielectric 24 interposed between semiconductor layer 22 and stack of layers 33. In some cases, dielectric 24 may be regarded as part of stack of layers 33. Alternatively, dielectric 24 may be considered separate from stack of layers 33. In addition, resist layer 32 may be formed above stack of layers 33. In some embodiments, semiconductor topography 20 may include additional layers formed upon and in contact with one or more of the layers shown in FIG. 1. Alternatively, semiconductor topography 20 may include fewer layers than shown in FIG. 1. For example, dielectric 24 may be omitted from semiconductor topography 20, in some embodiments.

Semiconductor layer 22 may be a semiconductor substrate such as a silicon substrate, and may be doped either n-type or p-type. More specifically, semiconductor layer 22 may be a monocrystalline silicon substrate or a silicon-germanium substrate. Alternatively, semiconductor layer 22 may include structures and layers formed upon a semiconductor substrate. The structures and layers may include, but are not limited to, dielectric layers, metallization layers, gate structures, contact structures, vias, or local interconnect wires. In some embodiments, the upper surface of semiconductor layer 22 may include an interlevel dielectric layer formed upon such structures and layers. In addition or alternatively, diffusion regions (not shown) may be formed in semiconductor layer 22. Moreover, semiconductor layer 22 may include isolation regions (not shown). In general, isolation regions may define the field regions of the semiconductor topography separating the active areas of the topography. As stated above, dielectric 24 may be formed upon semiconductor layer 22 and below stack of layers 33. In particular, dielectric 24 may serve as a gate dielectric or interlevel dielectric formed beneath stack of layers 33. Dielectric 24 may include, for example, silicon dioxide ($SiO_2$), silicon nitride ($Si_xN_y$), silicon dioxide/silicon nitride (ON), or tetraethylorthosilicate glass (TEOS) based silicon dioxide. Dielectric 24 may have a thickness, for example, between approximately 50 angstroms to approximately 5000 angstroms. However, larger and smaller thicknesses of dielectric 24 may be used depending on the specifications of the device.

Layers 26, 28, and 30 may together form stack of layers 33. More specifically, anti-reflective layer 30 may be formed above cap layer 28, which may be formed above device layer 26 to form stack of layers 33. In some embodiments, anti-reflective layer 30 may be formed upon and in contact with cap layer 28. In addition or alternatively, cap layer 28 may be formed upon and in contact with device layer 26. In an alternative embodiment (not shown), stack of layers 33 may include additional layers such as dielectric 24 as discussed above or layers interposed between layers 26, 28, 30, and/or dielectric 24. In either embodiment, device layer 26 may be formed above dielectric 24. More specifically, device layer 26 may be formed upon and in contact with dielectric 24. Alternatively, device layer 26 may be formed upon and in contact with semiconductor layer 22 if dielectric 24 is omitted. In general, device layer 26 may be used to form a process structure of a subsequently formed device. Such a structure may be a gate conductor or an interconnect line, for example. As such, device layer 26 may include a conductive layer such as, doped polysilicon, aluminum, copper, titanium, tungsten, or a metal alloy. Device layer 26 may have a thickness, for example, between approximately 300 angstroms to approximately 3000 angstroms. However, larger and smaller thicknesses of device layer 26 may be used depending on the specifications of the device.

Cap layer 28 may serve to protect portions of underlying layers and structures within semiconductor layer 22, dielectric 24, and/or device layer 26. For example, cap layer 28 may protect portions of device layer 26 from an etch process which may be used to form structures from device layer 26 as described in more detail below. As such, cap layer 28 preferably includes a material of different etch characteristics than device layer 26. In addition or alternatively, cap layer 28 may be used to strap subsequently formed gate regions of opposite conductivity type together. In particular, cap layer 28 may provide a conductive path across a p-n junction formed when a polysilicon connection is made to gates of opposite conductivity type. In such an embodiment, cap layer 28 may also serve to reduce gate resistance. As such, cap layer 28 may include a low-resistivity material, such as tungsten, tungsten silicide, cobalt silicide, titanium silicide, or nickel silicide, in some embodiments.

In some cases, cap layer 28 may further or alternatively include a diffusion barrier layer. Such a layer is preferably formed upon and in contact with device layer 26 such that impurities in device layer 26 may be prevented from diffusing into overlying layers. The materials of such a diffusion barrier layer may include, for example, undoped polysilicon, silicon oxide, silicon nitride, silicon oxynitride, silicon dioxide/silicon nitride/silicon dioxide, tungsten nitride, and titanium nitride. In a preferred embodiment, cap layer 28 may include silicon nitride. In the most preferred embodiment, cap layer 28 may include a thermally grown silicon nitride layer. In either embodiment, cap layer 28 may have, for example, a thickness from approximately 500 angstroms to approximately 2,000 angstroms. Larger or smaller thicknesses of cap layer 28, however, may be appropriate depending on the semiconductor device being formed.

As stated above, anti-reflective layer 30 may be formed above cap layer 28. Anti-reflective layer 30 preferably includes a material with properties that may aid in producing a profile within overlying resist 32 that meets the design specifications of the device. In other words, the materials used for anti-reflective layer 30 may have properties that aid in minimizing the reflection of energy back toward an energy source and minimizing standing waves within overlying resist 32 during patterning of the resist layer. In a preferred embodiment, anti-reflective layer 30 may include organic materials. In other embodiments, anti-reflective layer 30 may include inorganic materials. The thickness of anti-reflective layer 30 may be between approximately 400 angstroms and approximately 3,000 angstroms. Larger or smaller thicknesses of anti-reflective layer 30, however, may be appropriate depending on the semiconductor device being formed.

Figure 2:
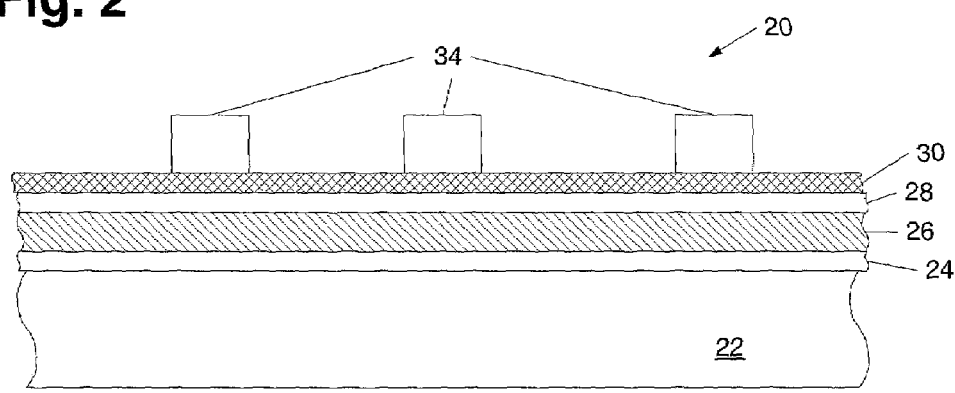
FIG. 2 depicts a partial cross-sectional view of the semiconductor topography in which the resist layer of FIG. 1 is patterned.

Resist 32 may include a photoresist, such as a deep ultraviolet resist, an I-line resist, a G-line resist, or another resist, such as an e-beam resist or an x-ray resist. The thickness of resist 32 may be between approximately 5000 angstroms and approximately 10,000 angstroms. Larger or smaller thicknesses of resist 32, however, may be used depending on the parameters of the fabrication process. Resist 32 may be patterned using a lithography technique to form device masks 34 as shown in FIG. 2. Although FIG. 2 illustrates the formation of three structures, any number of structures may be formed across semiconductor topography 20 in accordance with design specifications of the device. In addition, the structures may be formed with various dimensions and spacings therebetween in accordance with the design specifications of the device.

Figure 3:
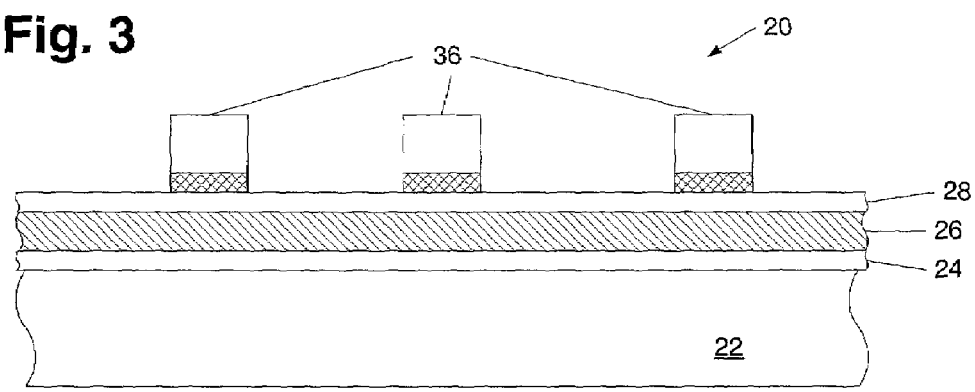
FIG. 3 depicts a partial cross-sectional view of the semiconductor topography in which a first layer of the stack of layers is etched subsequent to patterning the resist layer in FIG. 2.
Figure 4:
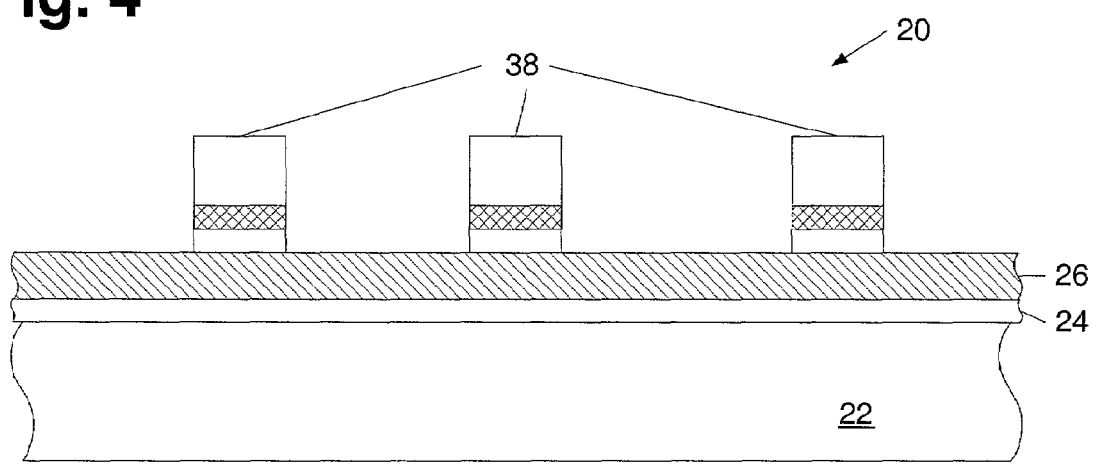
FIG. 4 depicts a partial cross-sectional view of the semiconductor topography in which a second layer of the stack of layers is etched subsequent to etching the first layer in FIG. 3.
Figure 5:
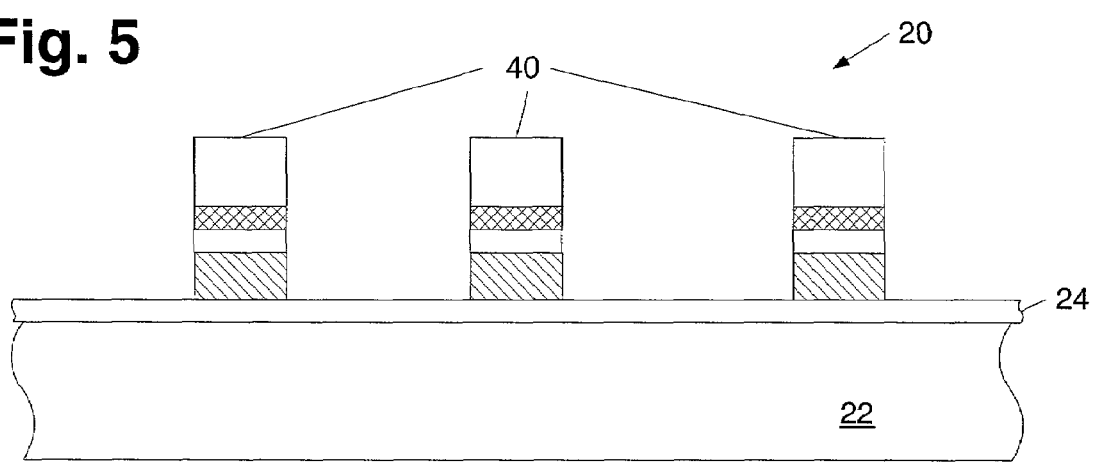
FIG. 5 depicts a partial cross-sectional view of the semiconductor topography in which a third layer of the stack of layers is etched subsequent to etching the second layer in FIG. 4.

After patterning device masks 34, exposed portions of semiconductor topography 20 may be etched as shown in FIGS. 3–5. In particular, exposed portions of anti-reflective layer 30 may be etched to form device masks 36 as shown in FIG. 3. FIG. 4 illustrates the removal of exposed portions of cap layer 28 to form structures 38, while FIG. 5 shows the formation of structures 40 subsequent to the removal of exposed portions of device layer 26. Such etch processes may be performed continuously until structures 40 are formed. Alternatively, the etch processes may be conducted in stages. In this manner, cleaning processes may be interposed between the one or more etch processes of stack of layers 33.

In some embodiments, the etch processes of FIGS. 3–5 may include the same etch chemistry. In such an embodiment, the etch chemistry may include fluorine-based elements. Alternatively, the etch processes of FIGS. 3–5 may include different etch chemistries such that each etch process is distinct from one another. For example, anti-reflective layer 30 may be etched with an etch chemistry including $CF_4$. In some embodiments, such an etch chemistry may further include $CHF_3$. The ratio of $CF_4$ to $CHF_3$ may be between approximately 100:0 and approximately 60:40, for example. In some cases, $O_2$ may be added to the etch chemistry of anti-reflective layer 30. Such an introduction of $O_2$ is preferably less than approximately 10% of the total concentration of the etch chemistry. In a preferred embodiment, the etch process of anti-reflective layer 30 may include etching a portion of cap layer 28. Consequently, all exposed portions of anti-reflective layer 30 may be removed. The etch chemistry used to etch cap layer 28 may include, for example, $SF_6$, $NF_3$, $CF_4$, or $CH_2F_2$. The etch chemistry used to etch device layer 26, on the other hand, may include, for example, $Cl_2$ or a form thereof. In some embodiments, the etch chemistry used to etch device layer 26 may include HBr.

Regardless of the fabrication process and etch chemistry used, anti-reflective layer 30, cap layer 28, and device layer 26 are preferably etched within the same chamber. In particular, each layer of stack of layers 33 may be etched within an etch tool designed to etch materials comprising silicon. For example, the etch tool may be a plasma etch tool with a plasma density between approximately $2.0 \times 10^9$ molecules/cm$^3$ and approximately $2.0 \times 10^{11}$ molecules/cm$^3$. Such a plasma density range may be representative of a range sometimes referred to as a "low-density plasma". In addition, such a plasma etch tool may include a control mechanism with which to control the temperature of the wafer. For example, the temperature of semiconductor topography 20 may be maintained between approximately 25° C. and 90° C. during the etch processes of FIGS. 3–5. Moreover, the etch chamber used for the etch processes of FIGS. 3–5 may include a pressure between approximately 0.4 mTorr and approximately 50 mTorr.

In an alternative embodiment, the etching of anti-reflective layer 30, cap layer 28, and device layer 26 may be conducted in more than one etch chamber. For example, anti-reflective layer 30 may be etched in a different chamber than that of cap layer 28 and device layer 26. Alternatively, device layer 26 may be etched in a different chamber than anti-reflective layer 30 and cap layer 28. In yet another embodiment, each of anti-reflective layer 30, cap layer 28, and device layer 26 may be etched in different chambers.

In some embodiments, exposed portions of dielectric 24 may be etched subsequent to the etching process of device layer 26. Such an etch process may be performed in the same etch chamber as the etch processes of FIGS. 3–5. Alternatively, the etch process of dielectric 24 may be etched in a different chamber than the etch processes of FIGS. 3–5. In yet another embodiment, dielectric 24 may not be etched at all.

One or more of the etch processes of FIGS. 3–5 may further include an introduction of a noble gas heavier than helium into the etch chamber. It is postulated that the introduction of a noble gas heavier than helium may produce a more aggressive etch chemistry due to the higher mass of the noble gas. In particular, it is believed that the noble gas may cause the semiconductor topography to be physically sputtered within the etch chamber, thereby removing defects contained upon the surface of the topography. Consequently, the introduction of such a noble gas may advantageously reduce, prevent, or eliminate the production of defects. Such a noble gas may include, for example, argon, xenon, neon, krypton, or radon. In addition, the flow rate of the noble gas into the etch chamber may be greater than approximately 10 standard cubic centimeters per minute (sccm). In some embodiments, the flow rate of the noble gas into the etch chamber may between approximately 10 sccm and approximately 100 sccm. More specifically, the flow rate of the noble gas into the etch chamber may be approximately 50 sccm. In general, a larger flow rate of the noble gas may produce a more vertical etch profile of the etch semiconductor structure.

In one embodiment, the introduction of a noble gas heavier than helium may be included in each of the etch processes of FIGS. 3–5. In another embodiment, the introduction of a noble gas heavier than helium may only be during the etch process of anti-reflective layer 30. In yet another embodiment, the introduction of a noble gas heavier than helium may be during the etch process of anti-reflective layer 30 and cap layer 28. In some cases, the noble gas introduced into the etch chamber may be the same during the multiple etch processes with which it is used. Alternatively, a different noble gas may be introduced for each of the multiple etch processes. In such an embodiment, a second noble gas different from the first noble gas and heavier than that of helium may be introduced into the etch chamber during at least one of the etching processes. In some cases, a third noble gas different from the first and second noble gases and heavier than that of helium may be introduced into the etch chamber during at least one of the etching processes. In some embodiments, multiple noble gases may be introduced into the etch chamber during one of the etch processes. For example, a plurality of noble gases heavier than helium may be introduced into the etch chamber while etching one or more layers of stack of layers 33. In another embodiment, one or more noble gases heavier than helium and helium itself may be introduced into the etch chamber during one or more of the etch processes.

Figure 6:
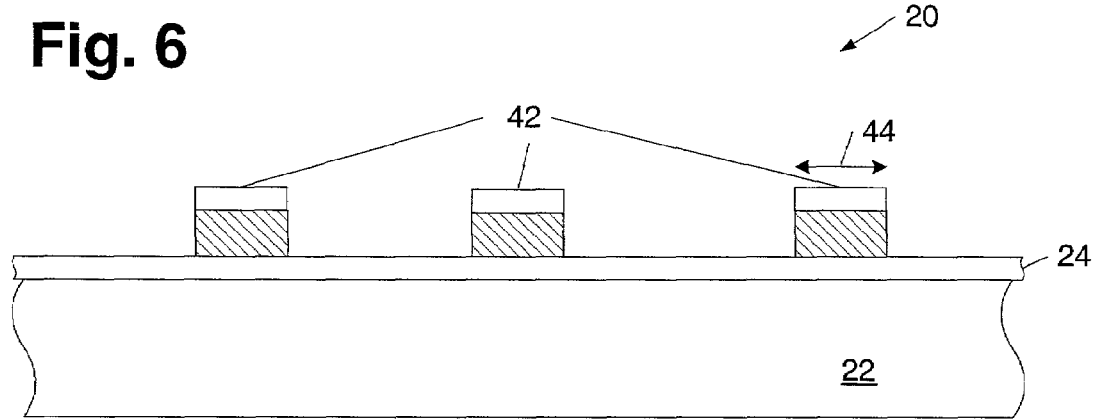
FIG. 6 depicts a partial cross-sectional view of the semiconductor topography in which the remaining portions of the resist layer and the first layer of the stack of layers are removed subsequent to etching the third layer in FIG. 5.

Patterned resist 32 and anti-reflective layer 30 may be removed subsequent to the etch processes of FIGS. 3–5 as shown in FIG. 6. Alternatively, patterned resist 32 and anti-reflective layer 30 may be removed subsequent to the etch process of cap layer 28 in FIG. 4. In this manner, portions of cap layer 28 within structures 38 may serve as a hard mask for the subsequent etch processes of FIG. 5. In yet another embodiment, patterned resist 32 may be removed subsequent to the etch process of FIG. 3 or 4 while anti-reflective layer 30 may remain for the subsequent etch processes of FIGS. 4 and 5, respectively. In some cases, anti-reflective layer 30 may be removed along with the etch processes of FIG. 4 or 5 when patterned photoresist has been previously removed. In either embodiment, the removal of resist 32 and/or anti-reflective layer 30 may be by a stripping process such as a wet etch or a reactive ion etch stripping process.

As stated above, conventional etch processes typically produce defects within an etched semiconductor topography. Depending on a defect's size, location, and composition, a defect within a device may cause a failure within a subsequently formed integrated circuit. Defects from conventional etching processes may include a variety of shapes and compositions. For example, in an embodiment in which a semiconductor topography comprising a nitride layer and a polysilicon layer is etched, nitride and polysilicon bilayer defects may be formed. In contrast, in an embodiment in which a semiconductor topography comprising an oxide layer and a monocrystalline silicon layer is etched, oxide and monocrystalline silicon bilayer defects may be formed. Such clumps may be cylindrically shaped with a portion of nitride or oxide formed upon a portion of polysilicon or monocyrstalline silicon, respectively. Other defect compositions may be formed during the etch process depending on the compositions of the layers of the topography. In particular, the composition of the defect formed during the etch process may depend on the materials included in cap layer 28 and device layer 26. A semiconductor topography with a thermally grown silcon nitride layer, however, may be particularly susceptible to such defect formations.

In some cases, tri-layer defects may be formed during conventional etch processes. Such tri-layer defects may include a portion of an anti-reflective layer arranged upon portions of the materials included in cap layer 28 and device layer 26. A semiconductor topography with an anti-reflective layer comprising organic material may be particularly susceptible to such defect formations. The portion of the anti-reflective layer, however, may be removed in subsequent etching processes or cleaning steps, thereby forming bi-layer defects as described above. Conventional etch processes may produce varying sizes and quantities of such bilayer defects. For example, the diameter of the bilayer mounds may be between approximately 20 nm and approximately 100 nm. In addition, conventional etch processes may produce between approximately 10 defects/cm$^2$ and approximately 100 defects/cm$^2$ of such bilayer mounds.

It is postulated that such bilayer defects may be caused by thickness non-uniformity of the cap layer. In particular, in an embodiment in which the thickness of the cap layer is not uniform across the semiconductor topography, the conventional etch process may not completely remove portions of the cap layer. Remaining portions of the cap layer may prevent the subsequent etch of the underlying layer, thereby producing bilayer mound defects. Another cause of such bilayer mounds may be from defects formed during the deposition of the cap layer and/or an anti-reflective layer formed upon the cap layer prior to the etching process. In particular, the mounds may be byproducts of the presence of ammonia hydroxide used during the formation of a cap layer. In addition or alternatively, the bilayer mounds may be caused by air bubbles and/or particles formed within the anti-reflective layer during its deposition. More specifically, such air bubbles and particles may cause the bilayer defects to form during the etching processes of any of the three layers.

The etch processes of FIGS. 3–5, on the other hand, are preferably conducted such that the formation of defects within etched portions of semiconductor topography 20 is reduced, prevented, and/or eliminated. In particular, the formation of bilayer mounds may be reduced, prevented, and/or eliminated during the etch processes of FIGS. 3–5. More specifically, the number of bilayer defects produced by the etch processes of FIGS. 3–5 may be reduced to be between 0 defects/cm$^2$ and approximately 3 defects/cm$^2$. Such a reduction and/or elimination of defects may advantageously produce a greater number of functional devices within a given lot of wafers.

In addition, the etch processes of FIGS. 3–5 may include forming semiconductor structures 42 within semiconductor topography 20 as shown in FIG. 6. Semiconductor structures 42 may include, for example, gate structures or interconnect lines. In a preferred embodiment, semiconductor structures 42 may include dimension 44 within a critical dimension specification of the device. Such a critical dimension specification may be the same as used for a similar device formed from conventional etch processes. As such, the etch processes of FIGS. 3–5 may not alter the critical dimension budget of the device. For example, the critical dimension of a device may be 0.17 microns +/−20 nm using either conventional etch techniques or the method described herein. As such, dimension 44 may be between 0.16998 microns and 0.17002 microns in such an embodiment.

In some cases, the etch chamber used for the etching processes of FIGS. 3–5 may be adapted to form dimension 44 of semiconductor structures 42 within such a critical dimension specification. In particular, an etch chamber designed to etch materials comprising silicon may be used for the etching processes of FIGS. 3–5. Such an etch chamber may be adapted to produce a plasma density between approximately $2.0 \times 10^9$ molecules/cm$^3$ and approximately $2.0 \times 10^{11}$ molecules/cm$^3$. In addition, the silicon etch chamber may be adapted to control the temperature of semiconductor topography 20. For example, the temperature of semiconductor topography 20 may be maintained between approximately 25° C. and 90° C. during the etch processes of FIGS. 3–5. Moreover, the etch chamber used for the etch processes of FIGS. 3–5 may include a pressure between approximately 0.4 mTorr and approximately 50 mTorr.

Figure 7:
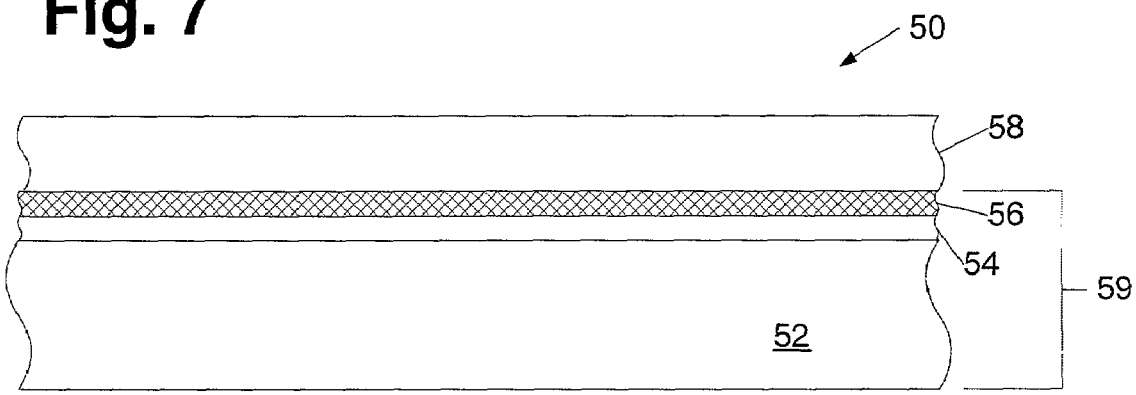
FIG. 7 depicts a partial cross-sectional view of a semiconductor topography, in an alternative embodiment, in which a resist layer is formed upon a stack of layers.

FIGS. 7–12 illustrate an alternative embodiment of the method as described herein. In particular, FIG. 7 is a partial cross-sectional view of semiconductor topography 50, which includes resist 58 formed upon stack of layers 59. Stack of layers 59 may include anti-reflective layer 56 arranged upon cap layer 54, which may be arranged upon semiconductor layer 52. In some embodiments, anti-reflective layer 56 may be formed upon and in contact with cap layer 54. In addition or alternatively, cap layer 54 may be formed upon and in contact with semiconductor layer 52. In an alternative embodiment (not shown), stack of layers 59 may include additional layers interposed between layers 52, 54, 56, and/or 58. For example, stack of layers 59 may include a dielectric layer interposed between cap layer 54 and semiconductor layer 52. Such a dielectric layer may serve as a "pad oxide" to reduce inherent stresses between a cap layer 54 and semiconductor layer 52. For example, the dielectric layer may serve to reduce the stresses between semiconductor layer 52 and cap layer 54 of stack of layers 59, when cap layer 54 includes silicon nitride. In some embodiments, the dielectric may also promote adhesion of an overlying layer upon semiconductor layer 52. The dielectric layer may include, for example, silicon dioxide ($SiO_2$), silicon oxynitride ($SiO_xN_y(H_z)$), or silicon dioxide/silicon nitride/silicon dioxide (ONO).

In an embodiment, semiconductor layer 52, cap layer 54, anti-reflective layer 56, and resist 58 may be similar to that of semiconductor layer 22, cap layer 28, anti-reflective layer 30, and resist 32 of FIGS. 1–6. In particular, semiconductor layer 52, cap layer 54, anti-reflective layer 56, and resist 58 may include similar materials and thicknesses to those of semiconductor layer 22, cap layer 28, anti-reflective layer 30, and resist 32. For example, semiconductor layer 52 may be a semiconductor substrate such as a monocrystalline silicon substrate or a silicon-germanium substrate. In addition, cap layer 54 may serve to protect portions of semiconductor layer 52 from an etch process which may be used to form structures within semiconductor layer 52 as described in more detail below. In addition or alternatively, cap layer 54 may serve as a diffusion barrier. As such, cap layer 54 may include, for example, undoped polysilicon, silicon oxide, silicon nitride, silicon oxynitride, silicon dioxide/silicon nitride/silicon dioxide, tungsten nitride, and titanium nitride. In a preferred embodiment, cap layer 54 may include silicon nitride. In the most preferred embodiment, cap layer 54 may include a thermally grown silicon nitride layer.

Figure 8:
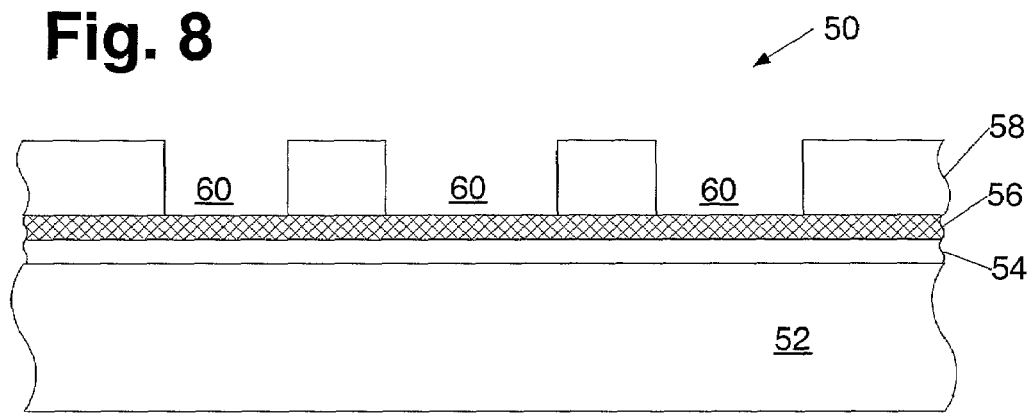
FIG. 8 depicts a partial cross-sectional view of the semiconductor topography in which the resist layer of FIG. 7 is patterned.

Moreover, anti-reflective layer 56 may include a material with properties that may aid in producing a profile within overlying resist 58 that meets the design specifications of the device. In a preferred embodiment, anti-reflective layer 56 may include organic materials. In other embodiments, anti-reflective layer 56 may include inorganic materials. Furthermore, resist 58 may include a photoresist, such as a deep ultraviolet resist, an I-line resist, a G-line resist, or another resist, such as an e-beam resist or an x-ray resist. Resist 58 may be patterned using a lithography technique to form openings 60 as shown in FIG. 8. Although FIG. 8 illustrates the formation of three openings, any number of openings may be formed across semiconductor topography 50 in accordance with design specifications of the device. In addition, openings 60 may be formed with various dimensions and spacings therebetween in accordance with the design specifications of the device.

Figure 9:
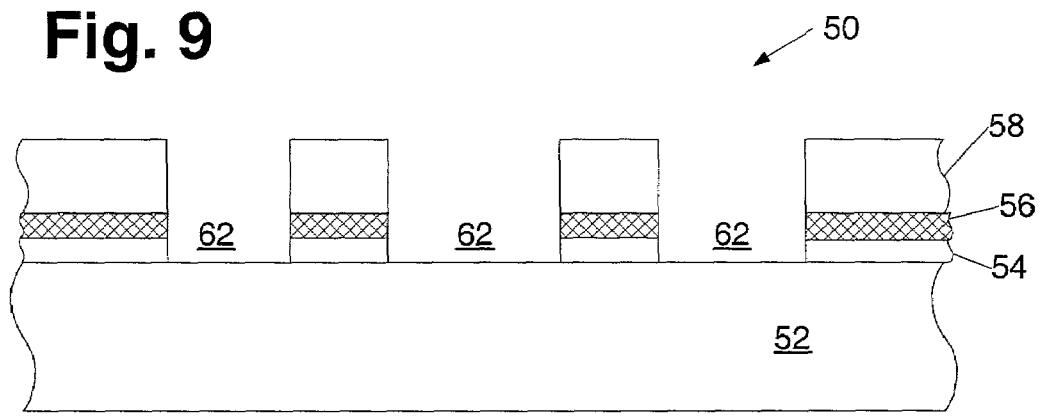
FIG. 9 depicts a partial cross-sectional view of the semiconductor topography in which a first layer and second layer of the stack of layers are etched subsequent to patterning the resist layer in FIG. 8.

Turning to FIG. 9, trenches 62 may be etched within exposed portions of anti-reflective layer 56 and cap layer 54. In some embodiments, the etch process may be continuous such that cap layer 54 is etched immediately after anti-reflective layer 56. Alternatively, the etch processes of each layer may be separated by a pause in the fabrication sequence. In some embodiments, a cleaning process may be introduced in between the etch processes. In addition or alternatively, the etch processes of FIGS. 8 and 9 may include different etch chemistries such that each etch process is distinct from one another. For example, anti-reflective layer 56 may be etched with an etch chemistry including $CF_4$. In some embodiments, such an etch chemistry may further include $CHF_3$. In some cases, $O_2$ may be added to the etch chemistry of anti-reflective layer 56. In a preferred embodiment, the etch process of anti-reflective layer 56 may include etching a portion of cap layer 54. Consequently, all exposed portions of anti-reflective layer 56 may be removed. The etch chemistry used to etch cap layer 54 may include, for example, $SF_6$, $NF_3$, $CF_4$, or $CH_2F_2$.

In either embodiment, the etch processes of anti-reflective layer 56 and cap layer 54 is preferably conducted within the same etch chamber. Such an etch chamber may an etch tool designed to etch materials comprising silicon. Such an etch tool may be a plasma etch tool with a plasma density between approximately $2.0 \times 10^9$ molecules/cm$^3$ and approximately $2.0 \times 10^{11}$ molecules/cm$^3$. In addition, such a plasma etch tool may include a control mechanism with which to control the temperature of semiconductor topography 50. For example, the temperature of semiconductor topography 20 may be maintained between approximately 25° C. and 90° C. during the etch processes of FIGS. 8 and 9. Moreover, the etch chamber used for the etch processes of FIGS. 8 and 9 may include a pressure between approximately 0.4 mTorr and approximately 50 mTorr. In an alternative embodiment, etching of anti-reflective layer 56 and cap layer 54 may be conducted in different chambers.

Figure 10:
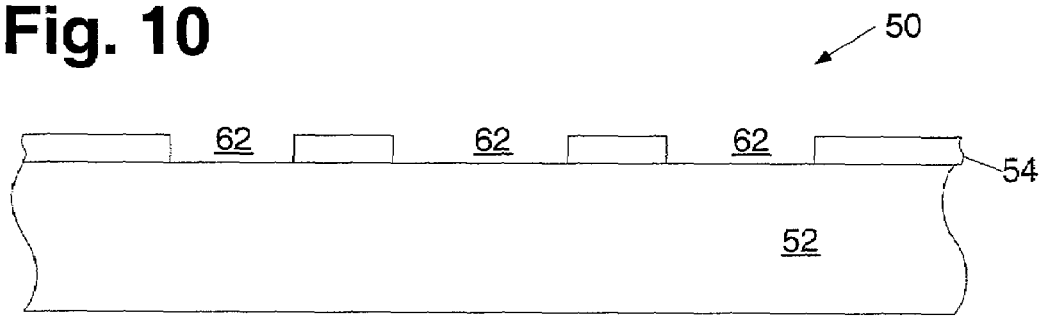
FIG. 10 depicts a partial cross-sectional view of the semiconductor topography in which the remaining portions of the resist layer and the first layer of the stack of layers are removed subsequent to etching the first and second layers of the stack of layers in FIG. 9.

The remaining portions of anti-reflective layer 56 and resist 58 may be removed as shown in FIG. 10. In this manner, the remaining portions of cap layer 54 may serve as a hardmask layer for the subsequent etch process of semiconductor layer 52. Alternatively, only the remaining portions of resist 58 may be removed subsequent to the etch process of FIG. 9. In such an embodiment, anti-reflective layer 56 and cap layer 54 may together serve as a hardmask layer for the subsequent etch process of semiconductor layer 52. In yet another embodiment, the remaining portions of anti-reflective layer 56 and resist 58 may be removed subsequent to the etch process of semiconductor layer 52.

Figure 11:
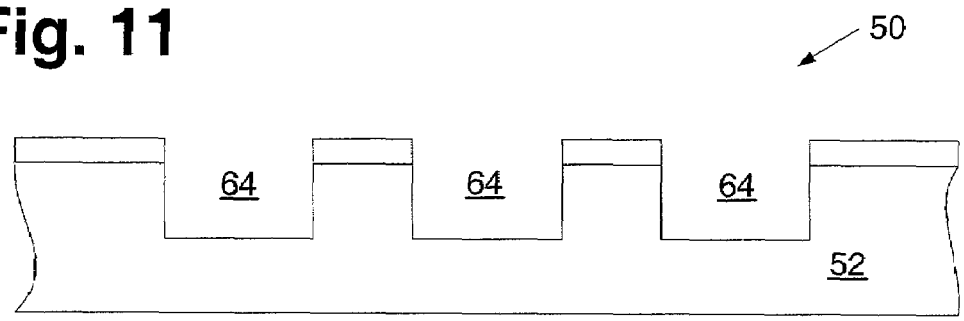
FIG. 11 depicts a partial cross-sectional view of the semiconductor topography in which trenches are formed within the third layer of the stack of layers subsequent to the removal of the remaining portions of the resist layer and the first layer of the stack of layers in FIG. 10.

Regardless of whether resist 58 and/or anti-reflective layer 56 has been removed from semiconductor topography 50, exposed portions of semiconductor layer 52 may be removed to form trenches 64 as shown in FIG. 11. Such an etch process may be performed in the same etch chamber as the etch processes of FIGS. 8 and 9. In particular, etching semiconductor layer 52 nay include placing semiconductor topography 50 into an etch chamber designed to etch materials comprising silicon. Such an etch chamber may be a plasma etch tool adapted to produce a plasma density between approximately $2.0 \times 10^9$ molecules/cm$^3$ and approximately $2.0 \times 10^{11}$ molecules/cm$^3$. In addition, the etch tool may be adapted to maintain the temperature of semiconductor topography 50 between approximately 25° C. and 90° C. during the etch process of FIG. 11. Moreover, the etch chamber used for the etch processes of FIGS. 3–5 may include a pressure between approximately 0.4 mTorr and approximately 50 mTorr. In an alternative embodiment, the etching of semiconductor layer 52 may be conducted in a different etch chamber than that of cap layer 54 and anti-reflective layer 56. Alternatively semiconductor layer 52 may be etched in the same etch chamber as cap layer 54, but a different chamber than anti-reflective layer 56. The etch chemistry used to etch semiconductor layer 52 may include, for example, $CF_3Br$. In some embodiments, the etch chemistry used to etch device layer 26 may include HBr and/or $NF_3$.

Similar to the etch processes of FIGS. 3–5, the etch processes of FIGS. 8, 9, and/or 11 may include an introduction of a noble gas heavier than helium into the etch chamber. It is postulated that the introduction of a noble gas heavier than helium may advantageously reduce, prevent, or eliminate the production of defects. Such a noble gas may include, for example, argon, xenon, neon, krypton, or radon. In addition, the flow rate of the noble gas into the etch chamber may be greater than approximately 10 standard cubic centimeters per minute (sccm). In a preferred embodiment, the flow rate of the noble gas into the etch chamber may be approximately 100 sccm. In general, a larger flow rate of the noble gas may produce a more vertical etch profile of the etch semiconductor structure.

In one embodiment, the introduction of a noble gas heavier than helium may be included in each of the etch processes of FIGS. 8, 9, and 11. In another embodiment, the introduction of a noble gas heavier than helium may only be during the etch process of anti-reflective layer 56. In yet another embodiment, the introduction of a noble gas heavier than helium may be during the etch process of anti-reflective layer 56 and cap layer 54. In some cases, the noble gas introduced into the etch chamber may be the same during the multiple etch processes with which it is used. Alternatively, a different noble gas may be introduced for each of the etch processes. In such an embodiment, a second noble gas different from the first noble gas and heavier than that of helium may be introduced into the etch chamber during at least one of the etching processes. In some cases, a third noble gas different from the first and second noble gases and heavier than that of helium may be introduced into the etch chamber during at least one of the etching processes. In some embodiments, multiple noble gases may be introduced into the etch chamber during one of the etch processes. For example, a plurality of noble gases heavier than helium may be introduced into the etch chamber while etching stack of layers 59. In another embodiment, one or more noble gases heavier than helium itself may be introduced into the etch chamber while etching stack of layers 59.

As stated above, the introduction of a noble gas heavier than helium into an etch chamber during an etching process may advantageously reduce, prevent, or eliminate the production of defects. As such, the etch processes of FIGS. 8, 9, and 11, are preferably conducted such that the formation of defects within etched portions of semiconductor topography 50 is reduced, prevented, and/or eliminated. In particular, the formation of defects comprising bilayer mounds may be reduced, prevented, and/or eliminated during the etch processes of FIGS. 8, 9, and 11. More specifically, the number of bilayer defects produced by the etch processes of FIGS. 8, 9, and 11 may be reduced to be between 0 defects/cm$^2$ and approximately 3 defects/cm$^2$. Such a reduction and/or elimination of defects may advantageously produce a greater number of functional devices within a given lot of wafers.

Preferably, trenches 64 may be used to subsequently form shallow trench isolation regions within semiconductor layer 52. Such isolation regions may be field oxide regions, which may serve to isolate separate active regions on semiconductor layer 52 from one another. In another embodiment, trenches 64 may be used for the formation of, for example, contact structures using a Damascene process. In such an embodiment, trenches 64 may be configured to extend to a conductive region within semiconductor layer 52. The conductive region may be, for example, an underlying interconnect line or a conductive region of a device, such as source/drain regions of a transistor. Although FIG. 11 illustrates the formation of three trenches across the illustrated portion of semiconductor layer 52, any number of trenches may be formed across the substrate in accordance with design specifications of the integrated circuit. In addition, various widths and depths of the trenches may be formed in accordance with the design specifications of the integrated circuit.

Figure 12:
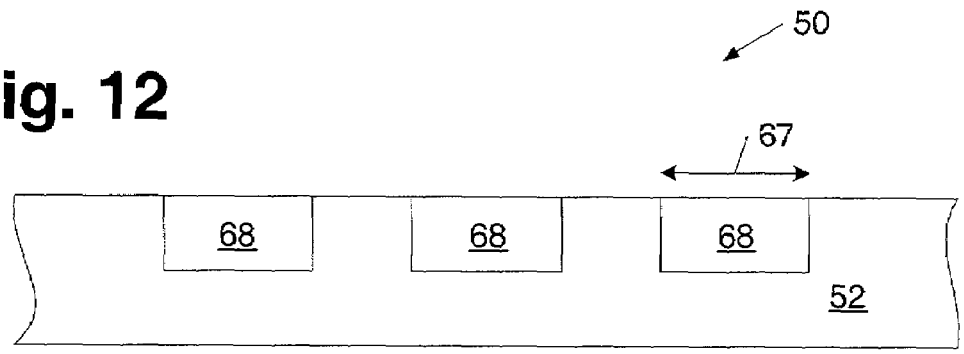
FIG. 12 depicts a partial cross-sectional view of the semiconductor topography in which semiconductor structures formed within the trenches subsequent to the formation of the trenches in FIG. 11.

Turning to FIG. 12, trenches 64 may be filled with a fill layer to form semiconductor structures 68. In some embodiments, the fill layer may be formed upon within trenches 64 and adjacent portions of semiconductor layer 52. Subsequently, the fill layer may be planarized to form semiconductor structures substantially planar with adjacent portions of semiconductor layer 52. The fill layer may include a variety of materials. For example, the fill layer may include conductive material such as doped polysilicon, titanium, tungsten, aluminum, or metal alloy thereof. In such an embodiment, semiconductor structures 68 may be interconnect lines, contacts, or vias formed within an interlevel dielectric layer.

In other embodiments, semiconductor structures 68 may be shallow trench isolation regions. As such, the fill layer may include a dielectric material such as, silicon dioxide ($SiO_2$), silicon oxynitride ($SiO_xN_y(H_z)$), silicon carbide, or carbonated polymers in some embodiments. Alternatively, the fill layer may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. The fill layer may also be undoped or may be doped to form, for example, low doped borophosphorus silicate glass (BPSG), low doped phosphorus silicate glass (PSG), or fluorinated silicate glass (FSG). Low doped BPSG may have a boron concentration of less than approximately 5% by weight. Low doped PSG may have a phosphorus concentration of less than approximately 10% by weight, and more preferably less than approximately 5% by weight.

In either embodiment, semiconductor structures 68 may preferably include dimension 67 within a critical dimension specification of the device. Such a critical dimension specification may be the same as used for a similar device formed from conventional etch processes. As such, the etch processes of FIGS. 8, 9, and 11 may not alter the critical dimension budget of the device. For example, the critical dimension of a device may be 0.17 microns +/−20 nm using either conventional etch techniques or the method described herein. As such, dimension 67 may be between 0.16998 microns and 0.17002 microns in such an embodiment. In some cases, the etch chamber used for the etching processes of FIGS. 8, 9, and 11 may be adapted to form dimension 67 of semiconductor structures 68 within such a critical dimension specification. In particular, an etch chamber designed to etch materials comprising silicon may be used for the etching processes of FIGS. 8, 9, and 11. Such an etch chamber may be adapted to produce a plasma density between approximately $2.0 \times 10^9$ molecules/cm$^3$ and approximately $2.0 \times 10^{11}$ molecules/cm$^3$. In addition, the silicon etch chamber may be adapted to control the temperature of semiconductor topography 50. For example, the temperature of semiconductor topography 50 may be maintained between approximately 25° C. and 90° C. during the etch processes of FIGS. 8, 9, and 11. Moreover, the etch chamber used for the etch processes of FIGS. 8, 9, and 11 may include a pressure between approximately 0.4 mTorr and approximately 50 mTorr.

It will be appreciated to those skilled in the art having the benefit of this disclosure that this invention is believed to provide a method and a system for processing a semiconductor topography. Further modifications and alternative embodiments of various aspects of the invention will be apparent to those skilled in the art in view of this description. It is intended that the following claims be interpreted to embrace all such modifications and changes and, accordingly, the drawings and the specification are to be regarded in an illustrative rather than a restrictive sense.

What is claimed is:

1. A method for processing a semiconductor topography, comprising:
   exposing the semiconductor topography to a first low density plasma comprising a first noble gas heavier than helium to etch an anti-reflective layer of the semiconductor topography;
   exposing the semiconductor topography to a second low density plasma comprising a second noble gas heavier than helium to etch portions of a nitride layer exposed during the etch of the anti-reflective layer; and
   exposing the semiconductor topography to a third low density plasma to etch portions of a polysilicon layer exposed during the etch of the nitride layer.

2. The method of claim 1, wherein the nitride layer comprises a silicon nitride layer, and wherein the method further comprises:
   thermally growing the silicon nitride layer upon the polysilicon layer; and
   forming the anti-reflective layer upon the silicon nitride layer.

3. The method of claim 1, wherein the steps of exposing the semiconductor topography to the first, second, and third low density plasmas are conducted within the same etch chamber.

4. The method of claim 1, wherein at least two of the first, second and third noble gases differ from one another.

5. The method of claim 1, wherein the step of exposing the semiconductor topography to the first low density plasma comprises introducing the first noble gas into an etch chamber comprising the semiconductor topography at a flow rate between approximately 10 sccm and approximately 100 sccm.

6. A method for processing a semiconductor topography, comprising:
   exposing the semiconductor topography to a first low density plasma comprising a first noble gas heavier than helium to etch an anti-reflective layer of the semiconductor topography;
   exposing the semiconductor topography to a second low density plasma comprising a second noble gas heavier than helium to etch portions of a first dielectric layer exposed during the etch of the anti-reflective layer; and
   exposing the semiconductor topography to a third low density plasma to etch portions of a semiconductor layer exposed during the etch of the first dielectric layer.

7. The method of claim 6, wherein the first dielectric layer comprises silicon oxide and wherein the semiconductor layer comprises a monocrystalline silicon substrate.

8. The method of claim 6, further comprising depositing a second dielectric material upon etched portions of the semiconductor layer to form an isolation region within the semiconductor topography.

9. The method of claim 6, wherein the steps of exposing the semiconductor topography to the first, second, and third low density plasmas are conducted within the same etch chamber.

10. The method of claim 6, wherein at least two of the first, second and third noble gases differ from one another.

11. The method of claim 6, wherein the step of exposing the semiconductor topography to the first low density plasma comprises introducing the first noble gas into an etch chamber comprising the semiconductor topography at a flow rate between approximately 10 sccm and approximately 100 sccm.

* * * * *